United States Patent
Park et al.

(10) Patent No.: US 9,978,841 B2
(45) Date of Patent: May 22, 2018

(54) GRAPHENE-BASED LAMINATE AND METHOD OF PREPARING THE SAME

(71) Applicant: Hanwha Techwin Co., Ltd., Changwon-si (KR)

(72) Inventors: ChongHan Park, Changwon-si (KR); SeungMin Cho, Changwon-si (KR); SunAe Seo, Seoul (KR); SoMyeong Shin, Seoul (KR)

(73) Assignee: Hanwha Techwin Co., Ltd., Changwon-si (KR)

( * ) Notice: Subject to any disclaimer, the term of this patent is extended or adjusted under 35 U.S.C. 154(b) by 0 days. days.

(21) Appl. No.: 15/046,920

(22) Filed: Feb. 18, 2016

(65) Prior Publication Data

US 2017/0221996 A1 Aug. 3, 2017

(30) Foreign Application Priority Data

Jan. 29, 2016 (KR) .................. 10-2016-0011873

(51) Int. Cl.
*H01L 21/00* (2006.01)
*H01L 29/00* (2006.01)
(Continued)

(52) U.S. Cl.
CPC .... *H01L 29/1606* (2013.01); *H01L 21/02527* (2013.01); *H01L 29/778* (2013.01);
(Continued)

(58) Field of Classification Search
CPC ......... H01L 21/02527; H01L 21/02491; H01L 21/0262; H01L 29/1606; H01L 29/78684; H01L 29/0673; H01L 29/66045; H01L 51/5221; H01L 51/5206; H01L 51/5203; H01L 21/823437; H01L 27/088; H01L 27/0222; H01L 27/1469; H01L 29/0649;
(Continued)

(56) References Cited

U.S. PATENT DOCUMENTS 7,061,176 B2* 6/2006 Kobayashi .......... H01L 51/5012
313/503
8,227,794 B2* 7/2012 Otsuji ................. H01L 21/8213
257/29

(Continued)

FOREIGN PATENT DOCUMENTS

KR 10-2012-0080168 A 7/2012
KR 10-2012-0125149 A 11/2012
(Continued)

OTHER PUBLICATIONS

Liu et al., "Organic Photovoltaic Devices Based on a Novel Acceptor Material: Graphene", 2003, Advanced Materials, vol. 20, pp. 3924-3930, published Oct. 17, 2008.*

(Continued)

*Primary Examiner* — Nikolay Yushin
(74) *Attorney, Agent, or Firm* — Sughrue Mion, PLLC (57) ABSTRACT

Provided are a graphene-based laminate and a method of preparing the graphene-based laminate. The graphene-based laminate may include a substrate; a graphene layer formed on at least one surface of the substrate; and an inorganic layer formed on the graphene layer and including a fluorine-containing lithium compound.

20 Claims, 6 Drawing Sheets

(51) Int. Cl.
  *H01L 51/52* (2006.01)
  *H01L 29/16* (2006.01)
  *H01L 29/786* (2006.01)
  *H01L 21/02* (2006.01)
  *H01L 29/778* (2006.01)
  *B82Y 40/00* (2011.01)
  *B82Y 30/00* (2011.01)
  *H01L 23/29* (2006.01)

(52) U.S. Cl.
  CPC .... *H01L 29/78684* (2013.01); *H01L 51/5215* (2013.01); *B82Y 30/00* (2013.01); *B82Y 40/00* (2013.01); *H01L 23/29* (2013.01)

(58) Field of Classification Search
  CPC ............ H01L 29/0847; H01L 29/1095; H01L 29/66568; H01L 29/78; H01L 29/0619; H01L 29/1087; H01L 29/1083; B82Y 40/00
  See application file for complete search history.

(56) References Cited

U.S. PATENT DOCUMENTS

| | | | | |
|---|---|---|---|---|
| 8,921,824 | B2* | 12/2014 | Shin | H01L 21/02527 257/9 |
| 2005/0048320 | A1* | 3/2005 | Kobayashi | H01L 51/5012 428/690 |
| 2012/0227787 | A1* | 9/2012 | Drori | H01L 31/0224 136/244 |
| 2012/0248401 | A1* | 10/2012 | Shin | H01L 21/02527 257/9 |
| 2013/0309475 | A1 | 11/2013 | Veerasamy | |
| 2014/0087501 | A1* | 3/2014 | Chen | H01L 51/5206 438/29 |
| 2014/0190550 | A1* | 7/2014 | Loh | H01L 51/445 136/244 |
| 2014/0231752 | A1 | 8/2014 | Shin et al. | |
| 2014/0293513 | A1* | 10/2014 | Eilertsen | H01G 9/042 361/528 |
| 2014/0332796 | A1* | 11/2014 | Zhou | H01L 51/5275 257/40 |
| 2015/0144899 | A1* | 5/2015 | Verilhac | H01L 51/0023 257/40 |

FOREIGN PATENT DOCUMENTS

| | | |
|---|---|---|
| KR | 10-2014-0103022 A | 8/2014 |
| KR | 10-2015-0044676 A | 4/2015 |
| KR | 10-1563231 B1 | 10/2015 |

OTHER PUBLICATIONS

Batzill, "The surface science of graphene: Metal interfaces, CVD synthesis, nanoribbons, chemical modification, and defects", 2012, Surface Science Reports, vol. 67, pp. 83-115, published Mar. 1, 2012.*

Wu, et al.; "A LiF Nanoparticle-Modified Graphene Electrode for High-Power and High-Energy Lithium Ion Batteries", Advanced Functional Materials, vol. 22, Apr. 2012, 8 pages total.

Communication dated Jul. 19, 2017, issued by the Korean Intellectual Property Office in counterpart Korean Patent Application No. 10-2016-0011873.

* cited by examiner

GRAPHENE-BASED LAMINATE AND METHOD OF PREPARING THE SAME

CROSS-REFERENCE TO THE RELATED APPLICATION

This application claims priority from Korean Patent Application No. 10-2016-0011873 filed on Jan. 29, 2016 in the Korean Intellectual Property Office the disclosure of which is incorporated herein in its entirety by reference.

BACKGROUND

1. Field

Apparatuses and methods consistent with exemplary embodiments of the inventive concept relate to a graphene-based laminate and a method of preparing the graphene-based laminate.

2. Description of the Related Art

Graphene has a two-dimensional structure having a hexagonal shape, in which a distance between two adjacent carbon atoms is about 1.42 Å. Graphene has excellent characteristics in terms of strength, thermal conductivity, and electron mobility, and thus, may be used in a transmissive electrode or various graphene-based electronic devices.

Accordingly, sheet resistivity or electric characteristics of graphene for electrode application have been controlled by using an interlayer material. Also, a charge-carrier density of graphene has been controlled by introducing a conductive material, a self-assembled monolayer, or chemical or optical materials on graphene, or by performing a simple ultraviolet (UV) radiation or an acid-base treatment process on graphene.

However, while these techniques may easily change the charge-carrier density, doping stability may be degraded.

Therefore, a graphene laminate having a novel structure, which is stable in terms of electron doping and has improved electron mobility, and a method of preparing such graphene laminate are needed.

SUMMARY

Exemplary embodiments of the inventive concept provide a graphene-based laminate with improved electron doping stability and electron mobility. The exemplary embodiments provide a method of preparing the graphene-based laminate which may be economical and may improve electron mobility.

Various aspects of the exemplary embodiments will be set forth in part in the description which follows and, in part, will be apparent from the description, or may be learned by practice of the presented embodiments.

According to an aspect of an exemplary embodiment, there is provided a graphene-based laminate which may include: a substrate; a graphene layer formed on at least one surface of the substrate; and an inorganic layer formed on the graphene layer and including a fluorine-containing lithium compound.

According to another aspect of an exemplary embodiment, there is provided a method of preparing a graphene-based laminate which may include: transferring a graphene layer onto a target substrate to dispose the graphene layer on at least one surface of the target substrate; and depositing an inorganic layer including a fluorine-containing lithium compound on the disposed graphene layer.

According to still another aspect of an exemplary embodiment, there is provided an organic light emitting device which may include: a first electrode including the above graphene-based laminate; a hole injection layer formed above the first electrode; a hole transport layer formed above the hole injection layer; an emission layer formed above the hole transport layer; an electron transport layer formed above the emission layer; an electron injection layer formed above the electron transport layer; and a second electrode.

According to yet another aspect of an exemplary embodiment, there is provided a transistor which may include: a gate layer; a substrate and an insulating layer formed above the gate layer; a source electrode and a drain electrode formed above the insulating layer; and the above graphene-based laminate contacting the source electrode and the drain electrode and disposed therebetween.

BRIEF DESCRIPTION OF THE DRAWINGS

These and/or other aspects will become apparent and more readily appreciated from the following description of the exemplary embodiments, taken in conjunction with the accompanying drawings, in which.

DETAILED DESCRIPTION

Reference will now be made in detail to exemplary embodiments of a graphene-based laminate and a method of preparing the graphene-based laminate examples of which are illustrated in the accompanying drawings, wherein like reference numerals refer to like elements throughout. In this regard, these embodiments may have different forms and should not be construed as being limited to the descriptions set forth herein. Accordingly, the embodiments are merely described below, by referring to the figures, to explain some aspects of the inventive concept. As used herein, the term "and/or" includes any and all combinations of one or more of the associated listed items. Expressions such as "at least one of," when preceding a list of elements, modify the entire list of elements and do not modify the individual elements of the list.

As used herein, when a portion "includes" an element, another element may be further included, rather than excluding the existence of the other element, unless otherwise described.

As used herein, the term "on" refers to directly on the other element or intervening elements may also be present As used herein, the term "graphene" refers to one polycyclic aromatic carbon compound or a plurality of the polycyclic aromatic carbon compounds having a plurality carbon atoms linked by a covalent bond (generally, an sp$^2$ bond) arranged in a planar shape, and the carbon atoms linked by a covalent bond may form a 6-membered ring as a basic repeating unit or may further include 3-membered ring, 4-membered ring, 5-membered ring, and/or 6 or more-membered ring.

As used herein, the term "graphene" includes all of monocrystalline, polycrystalline, and non-crystalline graphene, and refers to "pristine graphene" that does not have a functional groups attached on a surface thereof.

As used herein, the term "doping" refers to a process of preparing carriers by providing electrons to or removing electrons from a part of a conjugated bonding π-orbit to provide conductivity to a conjugated compound, e.g., a polycyclic aromatic carbon compound. In other words, when new electrons are added to or removed from a conjugated compound having a double bond, inside of hole molecules may be unbalanced, and thus, an electron orbit opens which allows migration of electrons. Here, the process of adding new electrons or removing electrons is referred to as "doping".

When a semiconductor device is manufactured, a graphene-based laminate having a transition metal oxide such as $Al_2O_3$ or $HfO_2$ deposited on graphene by atomic layer deposition (ALD) has been used.

However, the ALD process has an adhesion problem due to the hydrophobicity of graphene basal planes. Thus, prior to the ALD process, a nucleation site process, a metal vaporization process, and a post oxidation process need to be performed. However, despite these elaborate preparation processes, unexpected deterioration of charge mobility has been reported due to inherent impurity such as oxygen vacancy and soft optical phonons related to a large ion polarizibility of a high-k transition metal oxide.

In order to address the problem, an exemplary embodiment of the inventive concept provides a graphene-based laminate which includes a substrate, a graphene layer formed on at least one surface of the substrate, and an inorganic layer formed on the graphene layer. Here, the inorganic layer may include an inorganic material such as a fluorine-containing lithium compound.

According to an exemplary embodiment, the inorganic material included in the inorganic layer may be represented by Formula 1:

$$Li_xF_y \quad (1)$$

In Formula 1, x may satisfy 1≤x≤10, and y may satisfy 1≤y≤10.

According to an exemplary embodiment, the inorganic material may include at least one compound selected from LiF, $LiF_2$, $LiF_3$, $Li_2F$, and $Li_3F_3$. For example, the inorganic material may be LiF.

LiF is a polar dielectric having a high dielectric constant of about 9 and a large band gap of about 13.6 eV, and thus, a material including LiF is transparent. Due to such characteristics of a polar dielectric structure, electron affinity may be induced, and thus, a work function on a graphene layer may decrease during electron doping that forms the inorganic layer including a fluorine-containing lithium compound, i.e., a layer including the inorganic material represented by Formula 1, on the graphene layer.

Thus, in the graphene-based laminate according to the present exemplary embodiment, self-passivation effect may be caused by the inorganic layer including a fluorine-containing lithium compound, i.e., a layer including the inorganic material represented by Formula 1. Further, since a Fermi level may be controlled, stable electron doping may occur. Also, screening impurities having charges increases by the inorganic layer including a fluorine-containing lithium compound, and thus, a charge mobility may improve in the graphene-based laminate.

The inorganic layer may be in a form of a thin film.

Figure 1:
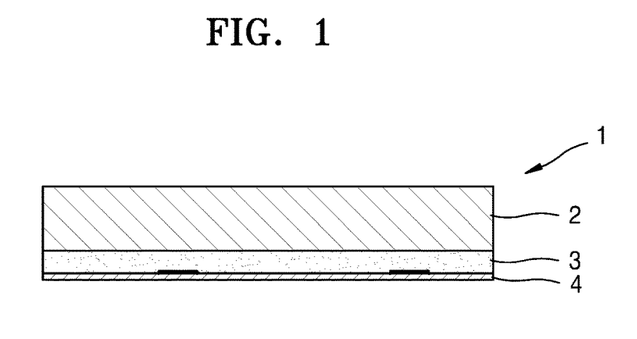
FIG. 1 is a schematic view of a graphene-based laminate according to an exemplary embodiment.

FIG. 1 is a schematic view of a graphene-based laminate 1, according to an exemplary embodiment.

As shown in FIG. 1, the graphene-based laminate 1 includes a graphene layer 3 formed on a substrate 2, and an inorganic layer 4 of a fluorine-containing lithium compound, e.g., a LiF layer, is formed on the graphene layer 3 in the form of a thin film. The inorganic layer 4 of a fluorine-containing lithium compound, e.g., a LiF layer, may be easily deposited on the graphene layer 3 by thermal chemical vapor deposition (CVD) at room temperature.

A thickness of the inorganic layer 4 of a fluorine-containing lithium compound, e.g., a LiF layer, may be irregular as a surface of the graphene layer 3 is uneven or bumpy.

An average thickness of the inorganic layer may be in a range of about 0.1 nm to about 10 nm. For example, an average thickness of the inorganic layer may be in a range of about 0.1 nm to about 5 nm.

As used herein, the term "average thickness" refers to a value of average taken after adding distances from a surface of the graphene layer 3, that is, where the graphene layer 3 is in contact with a surface of the inorganic layer 4, to an opposite surface of the inorganic layer 4. The average thickness may be obtained by measuring the distances with, for example, a field ion microscope, or may be obtained by measuring the distances through depth profiling using an x-ray photoelectron spectroscopy (XPS), but embodiments are not limited thereto, and any method available in the art for measuring an average thickness may be used.

When the average thickness of the inorganic layer is within the ranges above, stable electron doping effect with respect to the graphene layer may be sufficiently obtained while sufficiently maintaining characteristics of the graphene layer, and electron mobility improving effect may be sufficiently obtained.

The graphene layer may include one layer to ten layers. For example, the graphene layer may be a monolayer. The graphene layer is economical since sufficient electron doping effect and sufficient electron mobility improving effect may be obtained even when the graphene layer is a monolayer.

The graphene layer may include graphene having defects on a surface thereof. As used herein, the term "defects" refer to defects caused by physical damages, and, for example, the defects may include point defects, cracks, folds, or wrinkles.

When an inorganic layer including a fluorine-containing lithium compound, e.g., an inorganic layer represented by Formula 1, is formed on the graphene layer having defects thereon, about 95% of the entire surface area of the graphene layer has no defect, and thus the graphene-based laminate may obtain stable electron doping effect and sufficient electron mobility improving effect.

The substrate may include at least one material selected from a polymer-based material, a silica-based material, and a metal oxide-based material. Examples of the polymer-based material may include polyethylene terephthalate (PET), polyimide (PI), or polyacrylonitrile (PAN). Examples of the silica-based material may include $SiO_2$, glass, or quartz. Example of the metal oxide-based material may include $Al_2O_3$, sapphire, $TiO_2$, ZnO, $ZrO_2$, $HfO_2$, MgO, NiO, $Co_2O$, CuO, or FeO. For example, a thickness of the substrate may be in a range of about 10 nm to about 100 μm, but embodiments are not limited thereto.

The substrate may be a transfer substrate. The graphene layer on the transfer substrate may include graphene having defects on a surface thereof.

The graphene-based laminate may further include an additive layer between the graphene layer and the inorganic layer including a fluorine-containing lithium compound, e.g., the inorganic layer represented by Formula 1. According to an exemplary embodiment, the additive layer may include an additive, and examples of the additive may include a polymer curing resin, a thermoplastic resin, or a foaming agent. The additive layer may increase charge mobility of the graphene layer as well as adhesion strength with the graphene layer and may decrease a sheet resistance.

According to another exemplary embodiment, a method of preparing a graphene-based laminate includes transferring a graphene layer onto a target substrate to dispose the graphene layer on at least one surface of the target substrate; and depositing an inorganic layer including a fluorine-containing lithium compound on the graphene layer.

The inorganic layer may be represented by Formula 1.

The graphene layer may be grown on a substrate, on which graphene and graphitized catalyst layer are formed. An example of the substrate may be a copper foil.

The graphene and graphitized catalyst layer may include at least one catalyst selected from Cu, Ni, and an alloy thereof. The graphene and graphitized catalyst layer may grow graphene of a monolayer by controlling temperature and gas regardless of a type of the substrate. For example, the graphene and graphitized catalyst layer may grow graphene of a monolayer at a high temperature of about 1000° C. or higher.

The graphene layer may include one layer to 10 layers. For example, the graphene layer may be a monolayer. The graphene layer is economical since sufficient electron doping effect and sufficient electron mobility improving effect may be obtained even when the graphene layer is a monolayer.

The transferring of the graphene layer to the target substrate may further include etching the target substrate.

The transferring may be performed by, for example, forming a polymethylmethacrylate (PMMA) layer on a graphene layer/substrate laminate by using a common coating technique such as spin-coating. The substrate may be immersed and etched in an acidic solution, e.g., 0.1 M ammonium persulfate $(((NH_4)_2S_2O_8)$. The PMMA layer/graphene layer laminate may be washed with water, and the resultant may be transferred to the target substrate. Acetone and vacuum annealing may be performed on the PMMA layer.

Alternatively, the transferring may be performed by, for example, attaching adhesive film on the graphene layer/substrate laminate. The adhesive film may be, for example, an acrylate-based adhesive film. The substrate may be immersed in an acidic solution, for example, a predetermined amount of a solution including sulfuric acid and hydrogen peroxide ($H_2SO_4$, $H_2O_2$) to perform etching. Then, the adhesive film/graphene layer laminate may be washed with a predetermined amount of water, attached on the target substrate, and heated to a temperature in a range of about 100° C. to about 200° C. Thereafter, the adhesive film is removed from the substrate, and thus, graphene is transferred to the target substrate.

The target substrate may include at least one material selected from a polymer-based material, a silica-based material, and a metal oxide-based material. The polymer-based material, the silica-based material, and the metal oxide-based material are the same as defined herein.

An average thickness of the inorganic layer may be in a range of about 0.1 nm to about 10 nm. For example, an average thickness of the inorganic layer may be in a range of about 0.1 nm to about 5 nm. Definition and measuring method of the average thickness are the same as described herein.

When the average thickness of the inorganic layer is within these ranges, stable electron doping effect with respect to the graphene layer may be obtained while sufficiently maintaining characteristics of the graphene layer, and charge mobility improving effect may also be obtained.

The depositing of the inorganic layer may be performed by thermal chemical vapor deposition (CVD).

Figure 2:
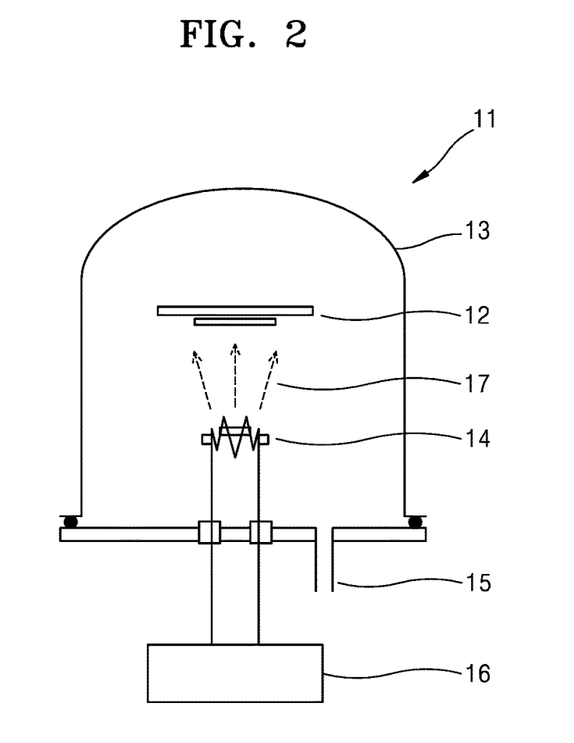
FIG. 2 is a schematic view of a thermal chemical vapor deposition (CVD) device according to an exemplary embodiment.

FIG. 2 is a schematic view of a thermal CVD device 11 according to an exemplary embodiment.

As shown in FIG. 2, the thermal CVD device 11 is equipped with a power source 16, an outlet 15, which is an external pathway, and a vacuum chamber 13. The vacuum chamber 13 includes a substrate 12 and a heat resistance wire (W) 14 therein. A metal vapor 17 is generated between the heat resistance wire (W) 14 and the substrate 12.

In order to deposit the inorganic layer including a fluorine-containing lithium compound, e.g., the inorganic layer represented by Formula 1, on the graphene layer, a graphitized catalyst is removed from the grown graphene layer, transferred to a substrate such as $SiO_2$, and a photolithography process is performed to prepare a graphene sample. Then, a source holder (a boat) holding the heat resistance wire (W) 14 is heated at a high vacuum in a range of about $10^{-5}$ torr to about $10^{-7}$ torr to melt and evaporate the inorganic material including a fluorine-containing lithium compound, e.g., the inorganic material represented by Formula 1, on the source holder (a boat). Here, the inorganic material represented by Formula 1 condenses on a surface of the graphene sample having a low temperature and thus may be deposited.

When the depositing of the inorganic layer is performed by thermal CVD, problems related to damages on the graphene layer by plasma generated in a sputtering process, heating cost for increasing a temperature of the sample during the CVD process or ALD process, and an adhesion strength between the deposition material and the graphene layer may be resolved.

According to another exemplary embodiment, an electrode may include an graphene-based laminate.

Figure 3:
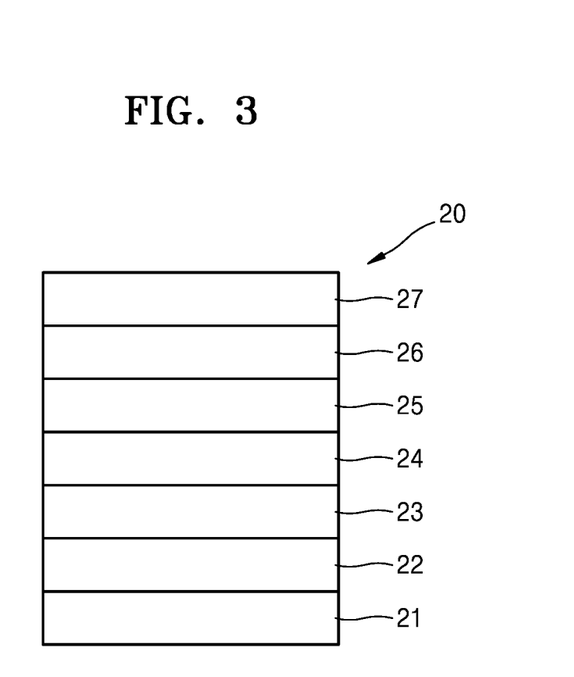
FIG. 3 is a schematic view of an organic light-emitting device according to an exemplary embodiment.

FIG. 3 is a schematic view of an organic light-emitting device 20 according to an exemplary embodiment.

As shown in FIG. 3, the organic light-emitting device 20 includes a substrate (not shown), a first electrode 21, a hole injection layer 22, a hole transport layer 23, an emission layer 24, an electron transport layer 25, an electron injection layer 26, and a second electrode 27.

The first electrode 21 may be an anode or a cathode. For example, the first electrode 21 may be an anode. Here, a substrate (not shown) of the organic light-emitting device may be a substrate generally used in an organic light-emitting device, and the substrate may be a glass substrate or transparent plastic substrate, each with excellent mechanical strength, thermal stability, transparency, surface smoothness, ease of handling, and water resistance. A material for the first electrode 21 may be indium tin oxide (ITO), indium zinc oxide (IZO), tin oxide ($SnO_2$), zinc oxide (ZnO), Al, Ag, or Mg having a good conductivity, and the first electrode 21 may be a transmissive electrode or a reflective electrode.

The first electrode 21 may be a transmissive electrode including a graphene-based laminate. The electrode may have a light transmittance that is lower than that of a transmissive electrode including only graphene.

Next, the hole injection layer 22 may be formed on the first electrode 21 by using various methods, such as vacuum-deposition, spin coating, casting, or Langmuir-Blodgett (LB) method.

When the hole injection layer 22 is formed by vacuum deposition, the deposition may be performed, e.g., at a deposition temperature of about 100° C. to about 500° C., a vacuum degree of about $10^{-8}$ torr to about $10^{-3}$ torr, and a deposition rate of about 0.01 □/sec to about 100 □/sec considering a compound for forming the hole injection layer 22 to be deposited and a desired structure and thermal characteristics of the hole injection layer 22 to be formed.

When the hole injection layer 22 is formed by spin coating, the coating may be performed, e.g., at a coating speed of about 2,000 rpm to about 5,000 rpm and at a temperature of about 80° C. to about 200° C. for removing a solvent after the coating considering a compound for forming the hole injection layer 22 to be deposited and a desired structure and thermal characteristics of the hole injection layer 22 to be formed.

Examples of a material for the hole injection layer 22 may include a phthalocyanine compound such as copper phthalocyanines, 4,4',4"-tris (3-methylphenylphenylamino)triphenylamine (m-MTDATA), N,N'-di(1-naphthyl)-N,N'-diphenylbenzidine (NPB), TDATA, 2T-NATA, polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), or polyaniline/poly(4-styrenesulfonate) (PANI/PSS), but embodiments are not limited thereto.

m-MTDATA

TDATA

2T-NATA

A thickness of the hole injection layer 22 may be in a range of about 100 □ to about 10000 □, for example, about 100 □ to about 1000 □. When the thickness of the hole injection layer 22 is within these ranges, excellent hole injection characteristics may be obtained without a substantial increase in driving voltage.

Next, the hole transport layer 23 may be formed on the hole injection layer 22 by using various methods such as vacuum deposition, spin coating, casting, or the Langmuir-Blodgett (LB) method. When the hole transport layer 23 is formed by vacuum-deposition or spin coating, deposition and coating conditions for the hole transport layer 23 may be determined by referring to the deposition and coating conditions for the hole injection layer 22.

Examples of a material for the hole transport layer 23 may include a carbazole derivative such as N-phenyl carbazole or polyvinyl carbazole, NPB, or an amine derivative having an aromatic condensed ring such as N,N'-bis(3-methylphenyl)-N,N'-diphenyl-[1,1-biphenyl]-4,4'-diamine (TPD).

A thickness of the hole transport layer 23 may be in a range of about 50 □ to about 1000 □, for example, about 100 □ to about 600 □. When the thickness of the hole transport layer 23 is within these ranges, excellent hole transport characteristics may be obtained without a substantial increase in driving voltage.

Next, the emission layer 24 may be formed on the hole transport layer 23 by using various methods such as vacuum deposition, spin coating, casting, or the LB method. When the emission layer 24 is formed by vacuum-deposition or spin coating, deposition and coating conditions for the emission layer 24 may be determined by referring to the deposition and coating conditions for the hole injection layer 22 although the deposition conditions may vary depending on a compound that is used to form the emission layer 24.

According to an exemplary embodiment, the emission layer 24 may include a host and a dopant. Examples of the dopant may include a fluorescent dopant or a phosphorescent dopant.

Examples of the host may include Alq3, 4,4'-N,N'-dicarboxylic carbazole-biphenyl (CBP), poly(n-vinylcarbazole) (PVK), 9,10-di(naphthalene-2-yl)anthracene (ADN), 1,3,5-tris(N-phenylbenzimidazol-2-yl)benzene (TPBI), 3-tert-butyl-9,10-di(naphth-2-yl)anthracene (TBADN), E3, or distyrylarylene (DSA), but embodiments are not limited thereto.

The dopant may be a red dopant, and examples of the red dopant may include PtOEP, Ir(piq)$_3$, Btp$_2$Ir(acac), or DCJTB, but embodiments are not limited thereto.

Ir(piq)₃

Ir(ppy)₂(acac)

Btp₂Ir(acac)

Ir(ppy)₂(acac)

Also, the dopant may be a green dopant, and examples of the green dopant may include Ir(ppy)₃ (where ppy=phenylpyrridine), Ir(ppy)₂(acac), Ir(mpyp)₃, or C545T, but embodiments are not limited thereto.

Ir(ppy)₃

C545T

Also, the dopant may be a blue dopant, and examples of the blue dopant may include F2Irpic, (F2ppy)2Ir(tmd), Ir(d-fppz)3, ter-fluorene, 4,4'-bis(4-diphenylaminostyryl)biphenyl (DPAVBi), or 2,5,8,11-tetra-t-butylperylene (TBP), but embodiments are not limited thereto.

F₂Irpic (F₂ppy)₂Ir(tmd)

-continued

Ir(ppy)₃

DPAVBi

TBP

An amount of the dopant may be in a range of about 0.1 part to about 20 parts by weight, or, for example, about 0.5 parts to about 12 parts by weight, based on 100 parts by weight of the material for the emission layer 24 (that is, the total weight of the host and the dopant is 100 parts by weight). When the amount of the dopant is within these ranges, concentration extinction may be practically prevented.

A thickness of the emission layer 24 may be in a range of about 100 Å to about 1000 Å, for example, about 200 Å to about 600 Å. When the thickness of the emission layer 24 is within these ranges, excellent emission characteristics may be obtained without a substantial increase in driving voltage.

When the emission layer 24 includes a phosphorescent dopant, a hole blocking layer (HBL) (not shown) may be formed on the emission layer 24 in order to prevent diffusion of triplet excitons or holes to the electron transport layer 25. Here, a material for the hole blocking layer is not particularly limited, and any material available in the art as a hole blocking material may be used. Examples of the hole blocking material may include an oxadiazol derivative, a triazol derivative, a phenanthroline derivative, Balq, or BCP.

A thickness of the hole blocking layer may be in a range of about 50 Å to about 1000 Å, for example, about 100 Å to about 300 Å. When the thickness of the hole blocking layer is within these ranges, diffusion of triplet excitons or holes to the electron transport layer 25 may be blocked without a substantial increase in driving voltage.

Next, the electron transport layer 25 may be formed by using various methods such as vacuum deposition, spin coating, or casting. When the electron transport layer 25 is formed by vacuum-deposition or spin coating, deposition and coating conditions for the electron transport layer 25 may be determined by referring to the deposition and coating conditions for the hole injection layer 22 although the deposition conditions may vary depending on a compound that is used to form the electron transport layer 25.

Examples of a material for the electron transport layer 25 may include a quinoline derivative, tris(8-hydroxyquinoline) aluminum(III) (Alq₃), TAZ, or Balq, but embodiments are not limited thereto.

A thickness of the electron transport layer 25 may be in a range of about 100 Å to about 1000 Å, for example, about 100 Å to about 500 Å. When the thickness of the electron transport layer 25 is within these ranges, excellent electron transport characteristics may be obtained without a substantial increase in driving voltage.

Also, the electron injection layer 26 having a function to facilitate injection of electrons from an anode may be deposited on the electron transport layer 25.

Examples of a material for the electron injection layer 26 may include LiF, NaCl, CsF, $Li_2O$, or BaO, which are generally used as a material for forming an electron injection layer in the art. Deposition and coating conditions for the electron injection layer 26 may be determined by referring to the deposition and coating conditions for the hole injection layer 22 although the deposition conditions and coating conditions may vary depending on a compound that is used to form the electron injection layer 26.

A thickness of the electron injection layer 26 may be in a range of about 1 Å to about 100 Å, for example, about 5 Å to about 90 Å. When the thickness of the electron injection layer 26 is within these ranges, excellent electron injection characteristics may be obtained without a substantial increase in driving voltage.

Then, the second electrode 27 may be formed on the electron injection layer 26 by vacuum deposition or sputtering. The second electrode 27 may be used as a cathode or an anode. A material for forming the second electrode 27 may be a material having a low work function, and such a material may be metal, alloy, an electrically conductive compound, or a mixture thereof. Examples the material for the second electrode 27 may include lithium (Li), magnesium (Mg), aluminum (Al), aluminum-lithium (Al—Li), calcium (Ca), magnesium-indium (Mg—In), or magnesium-silver (Mg—Ag). According to an exemplary embodiment, a transmissive cathode formed by using ITO or IZO may be used to obtain a top-emission device.

The organic light-emitting device 20 may be included in a variety type of flat panel display apparatuses, for example, a passive matrix organic light-emitting display apparatus and an active matrix organic light-emitting display apparatus. Particularly, when the organic light-emitting device 20 is included in an active matrix organic light-emitting display apparatus, a first electrode 21 disposed on a substrate is a pixel electrode, and the first electrode 21 may be electrically connected to a source electrode or drain electrode of a thin film transistor. In addition, the organic light-emitting device 20 may be included in a flat panel display apparatus that may display images on both sides.

Also, when an organic layer of the organic light-emitting device 20 includes a plurality of organic layers, at least one layer of the organic layer may be formed by deposition, or by using a wet processing of a coating process using a compound in the form of a solution.

According to another exemplary embodiment, an electronic device may include the graphene-based laminate. The electronic device may be, for example, a field effective transistor, but a shape or a type of the electronic device is not limited thereto, and any electronic device according to the need may be used. The field effective transistor (FET) may be, for example, a back-gated FET.

Figure 4:
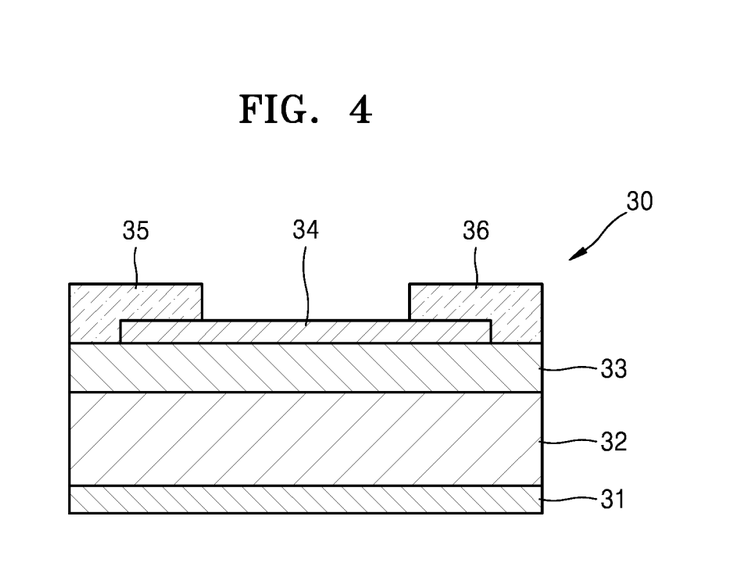
FIG. 4 is a schematic view of a back-gated field-effect transistor (FET) according to an exemplary embodiment.

FIG. 4 is a schematic view of a back-gated field-effect transistor (FET) 30 according to an exemplary embodiment.

As shown in FIG. 4, the back-gated FET 30 includes an Si-doped substrate 32 and an insulating layer 33 sequentially stacked as a back gate on a back gate contact surface 31. A graphene-based laminate channel layer 34 is in contact with a source electrode 35 and a drain electrode 36.

Here, a distance between the source electrode 35 and the drain electrode 36 may be determined by a use of the back-gated FET 30. For example, a distance between the source electrode 35 and the drain electrode 36 may be in a range of about 0.1 μm to about 1 mm, or, for example, about 1 μm to about 100 μm, or about 5 μm to about 100 μm.

Materials for the source electrode 35 and the drain electrode 36 are not particularly limited as long as they are conductive, and examples of the materials may include platinum, gold, silver, nickel, chrome, copper, iron, tin, antimony, lead, tantalum, indium, palladium, tellurium, rhenium, iridium, aluminum, ruthenium, germanium, molybdenum, tungsten, tin antimony oxide, indium tin oxide (ITO), fluorine-doped zinc oxide, zinc, carbon, graphite, glassy carbon, silver paste and carbon paste, lithium, beryllium, sodium, magnesium, potassium, calcium, scandium, titanium, manganese, zirconium, gallium, niobium, sodium-potassium alloy, magnesium, lithium, aluminum, magnesium/copper mixture, magnesium/silver mixture, magnesium/aluminum mixture, magnesium/indium mixture, aluminum/aluminum oxide mixture, or lithium/aluminum mixture, and when these materials are used, a film may be formed by sputtering or vacuum deposition to form an electrode.

The source electrode 35 and the drain electrode 36 may be formed by using a fluid electrode material such as a solution, a paste, an ink, or a dispersion including the conductive material. The dispersion containing metal particles may be, for example, a conductive paste, but any dispersion containing metal particles having a particle diameter in a range of about 0.5 nm to about 50 nm, or, for example, about 1 nm to about 10 nm may be used. Examples of a material for the metal particles may include platinum, gold, silver, nickel, chrome, copper, iron, tin, antimony, lead, tantalum, indium, palladium, tellurium, rhenium, iridium, aluminum, ruthenium, germanium, molybdenum, tungsten, or zinc.

A width and a length of the graphene-based laminate channel layer 34 may be each in a range of about 20 nm to about 20 μm. However, embodiments are not limited thereto, and the width and the length of the graphene-based laminate channel layer 34 may be appropriately controlled according to its use.

A material for the insulating layer 33 is not particularly limited as long as the material has electric insulating property and may be formed into a thin film. Examples of the material for the insulating layer 33 may include a metal oxide (including a silicon oxide), a metal nitride (including a silicon nitride), a polymer, or an organic low molecule, which has an electric resistance rate of about 10 Ωcm or higher at room temperature, and, for example, an inorganic oxide film having a high dielectric constant may be used.

Examples of the inorganic oxide may include a silicon oxide, an aluminum oxide, or a hafnium oxide, and a thickness of the inorganic oxide insulating layer may be in a range of about 100 nm to about 300 nm. Also, the inorganic oxide may include a silicon nitride or an aluminum nitride.

Examples of the insulating layer 33 including an organic compound may include polyimide, polyamide, polyester, polyacrylate, a photo-radical polymerization system, a photo-curing resin of a photo-cationic polymerization system, a copolymer containing an acrylonitrile component, polyvinyl phenol, polyvinyl alcohol, novolak resin, or cyanoethyl flurane.

In addition, wax, polyethylene, polychloroprene, polyethylene terephthalate, polyoxymethylene, polyvinyl chloride, polyvinylidene fluoride, polymethyl methacrylate, polysulfone, polycarbonate, polyimidecyanoethyl flurane, poly(vinyl phenol) (PVP), poly(methyl methacrylate) (PMMA), polycarbonate (PC), polystyrene (PS), polyolefin, polyacrylamide, poly(acrylic acid), novolac resin, resol resin, polyimide, poly-xylene, or a epoxy resin, as well as a polymer material such as fluranes having a high dielectric constant may be used.

The insulating layer 33 may be a mixture layer including a plurality of organic or inorganic compound materials as described above, and the insulating layer 33 may be a stacked laminate. In this case, a material having a high dielectric constant and a material having a water repellent property may be mixed or stacked according to the need, and thus a performance of the device may be controlled.

The insulating layer 33 may be formed by using a vacuum deposition method, a molecular beam epitaxial growth method, an ion cluster beam method, a low energy ion beam method, an ion plating method, a CVD method, a sputtering method, a dry processing such as an atmospheric pressure plasma method, or a wet processing including a coating process such as a spray coating method, a spin coating method, a blade coating method, a dip coating method, a casting method, a roll coating method, or a bar coating method, such as die coating method, or a patterning processing such as printing or ink-jet according to the material being used in forming the insulating layer 33. The wet processing may include a process of coating and drying a dispersion prepared by dispersing particles of an inorganic oxide in an organic solvent or water by using a dispersion agent such as a surfactant according to the need, or by coating and during an oxide precursor, such as an alkoxide solution, i.e., a sol-gel method.

The Si-doped substrate 32 as a back-gate has improved conductivity, and thus a contact resistance between the source electrode 35 and the drain electrode 36 may decrease due to the Si-doped substrate 32.

The graphene-based laminate may be used in a touch sensor, a semiconductor electrode or device, an electromagnetic wave shield device, or a sealing member, as well as in the FET.

Thereinafter, one or more embodiments will be described in detail with reference to the following examples. However, these examples are not intended to limit the scope of embodiments.

EXAMPLE (Preparation of Graphene-Based Laminate)

Example 1: Preparation of Graphene-Based Laminate

Graphene of a monolayer (thickness of about 0.34 nm) was grown on a 35 μm copper foil by using a halogen lamp heater and a rapid thermal CVD device.

An acrylate-based adhesive film was attached on the graphene layer/copper foil laminate. The copper foil was etched by immersing the laminate in 100 g/L of a sulfuric acid and hydrogen peroxide ($H_2SO_4$, $H_2O_2$) solution. Then, the adhesive film/graphene layer laminate was washed with a predetermined amount of water, attached to a $SiO_2$ substrate, and heated at a temperature in a range of about 100° C. to about 150° C. Thereafter, the adhesive film was separated from the substrate, and thus graphene was transferred.

Then, an LiF layer was deposited on the graphene of a monolayer transferred at a rate of 0.12 Å/s by using a thermal evaporator, and thus a graphene-based laminate was prepared.

Example 2: Preparation of Graphene-Based Laminate

A graphene-based laminate was prepared in the same manner as in Example 1, except that a thickness of the LiF layer deposited on the graphene layer was 5 nm instead of 1 nm.

Example 3: Preparation of Graphene-Based Laminate

A graphene-based laminate was prepared in the same manner as in Example 1, except that a thickness of the LiF layer deposited on the graphene layer was 10 nm instead of 1 nm.

Comparative Example 1: Preparation of Graphene-Based Laminate

A graphene-based laminate was prepared in the same manner as in Example 1, except that a thickness of the LiF layer was not deposited on the graphene layer.

(Preparation of Back-Gated FET)

Example 4: Preparation of Back-Gated FET

The back-gated FET shown in FIG. 4 was prepared.
100 nm of Au patterned by a lift-off process using a photoresist AZ5214 was used as a source electrode and a drain electrode. As a channel layer, the graphene-based laminate prepared in Example 1 was used. A length and width of the channel layer was 20 μm and 19 μm, respectively. The insulating layer was $SiO_2$ having a thickness of 300 nm.

Examples 5 and 6: Preparation of Back-Gated FET

Back-gated FETs were prepared in the same manner as in Example 4, except that the graphene-based laminates prepared in Examples 2 and 3 were respectively used as a channel layer instead of the graphene-based laminate prepared in Example 1.

Comparative Example 2: Preparation of Back-Gated FET

A back-gated FET was prepared in the same manner as in Example 4, except that the graphene-based laminate prepared in Comparative Example 1 was used as a channel layer instead of the graphene-based laminate prepared in Example 1.

Analysis Example 1: Light Transmittance Analysis

Graphene of a monolayer (thickness of about 0.34 nm) on the 35 μm copper foil in Example 1 was transferred onto a glass substrate having a thickness of about 800 μm. A graphene-based laminate having the graphene layer transferred onto the glass substrate was prepared as Comparative Reference Example 1, and a graphene-based laminate prepared by depositing an LiF layer at a thickness of 5 nm on the graphene layer transferred onto the glass substrate by using the method and the device used in Example 1 was prepared as Reference Example 1.

Light of wavelength in a range of about 350 nm to about 800 nm was irradiated on the graphene-based laminates prepared in Reference Example 1 and Comparative Reference Example 1 by using an UV spectrophotometer (U-4100 available from Hitachi) to measure light transmittance of the graphene-based laminates. The results are shown in FIG. 5.

Figure 5:
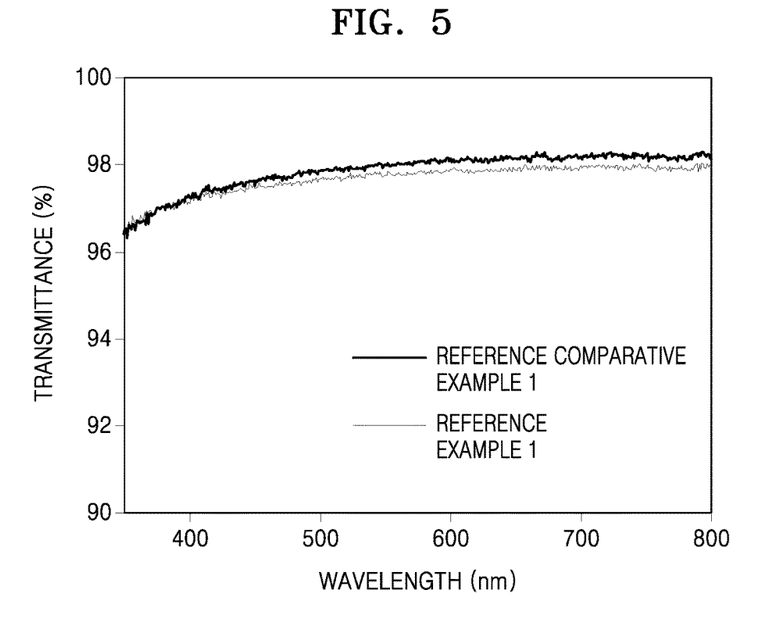
FIG. 5 is a graph of light transmittance measurement on graphene substrate laminates prepared in Reference Example 1 and Reference Comparative Example 1.

Referring to FIG. 5, the graphene-based laminate of Reference Example 1 (a graphene-based laminate having a LiF layer on a graphene layer) had only about 2.3% light transmittance decrease at a wavelength of 550 nm. That is, in terms of light transmittance, the graphene-based laminate of Reference Example 1 (a graphene-based laminate having a LiF layer on a graphene layer) had almost no difference with the graphene-based laminate of Comparative Reference Example 1 (a graphene-based laminate that does not have a LiF layer deposited on a graphene layer).

Analysis Example 2: Raman Spectrum Analysis

Raman light scattering test using a Raman light scattering photometer of a 514 nm laser (InVia, available from Renishaw) was performed on a channel layer of the graphene-based laminate of the back-gated FET of each of Example 5 and Comparative Example 2. The results are shown in FIG. 6.

Figure 6:
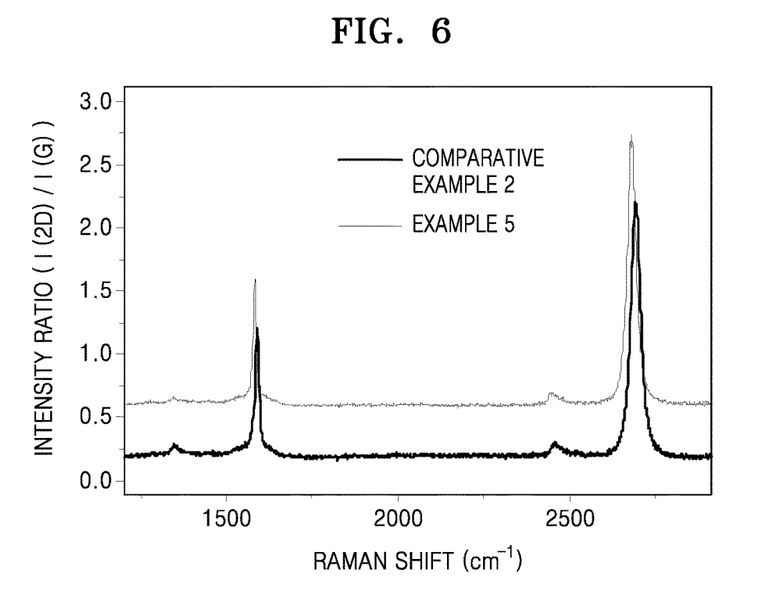
FIG. 6 shows a Raman spectrum of graphene substrate laminate channel layers of the back-gated FETs prepared in Example 5 and Comparative Example 2.

Referring to FIG. 6, $I(2D, 2700 \text{ cm}^{-1})/I(G, 1350 \text{ cm}^{-1})$ of the channel layer of the graphene-based laminate of the back-gated FET prepared in Comparative Example 2 was about 2.13. $I(2D, 2700 \text{ cm}^{-1})/I(G, 1350 \text{ cm}^{-1})$ of the channel layer of the graphene-based laminate of the back-gated FET prepared in Example 5 was about 2.26.

In this regard, it may be known that p-doping was strong and a hole charge concentration decreased in the channel layer of the graphene-based laminate of the back-gated FET prepared in Example 5.

Evaluation Example 1: Electric Characteristics Evaluation (1) Electric Characteristics Evaluation 1

Electric characteristics of the back-gated FETs of Examples 4 and 5 and Comparative Example 2 were evaluated. A dependent channel current of a gate source voltage ($V_{GS}$) with respect to the back-gated FETs was measured by applying a drain source voltage ($V_{DS}$=0.3V). The results are shown in FIGS. 7A to 7C.

Figure 7A:
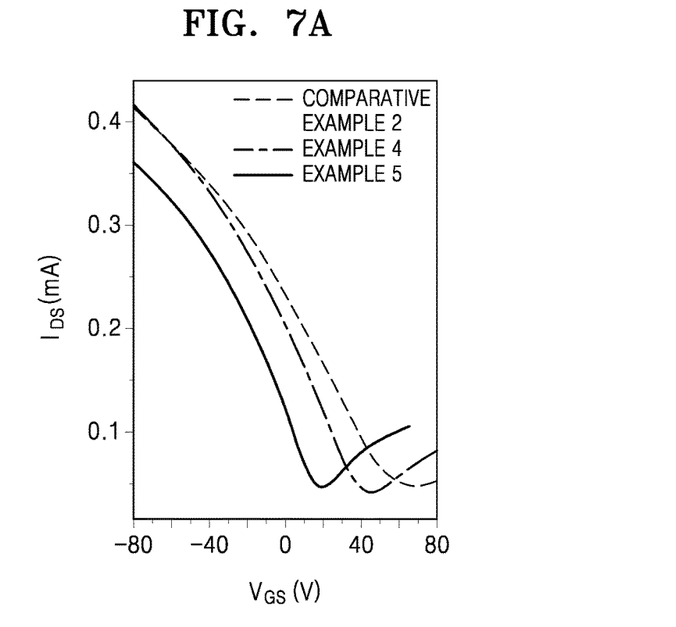
FIG. 7A is a graph showing $I_{DS}$–$V_{GS}$ obtained when a drain source voltage ($V_{DS}$=0.3V) is applied to the back-gated FETs prepared in Examples 4 and 5 and Comparative Example 2.

Referring to FIG. 7A, a charge neutral point gate voltage ($V_{np}$) of the back-gated FETs of Examples 4 and 5 moved in a direction of a negative voltage compared to that of the back-gated FET of Comparative Example 2, but both back-gated FETs maintained a positive voltage. Thus, it may be confirmed that the LiF layer deposited on the graphene layer in the back-gated FETs of Examples 4 and 5 had the graphene layer that is stably electron doped, and a hole charge concentration was also compensated in the graphene layer in the back-gated FETs of Examples 4 and 5.

Figure 7B:
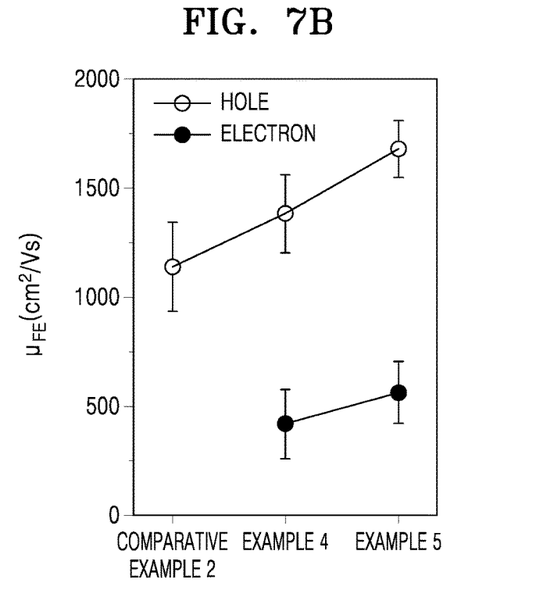
FIG. 7B is a graph showing a field effect mobility ($\mu_{FE}$) of electrons and holes of the back-gated FETs prepared in Examples 4 and 5 and Comparative Example 2.
Figure 7C:
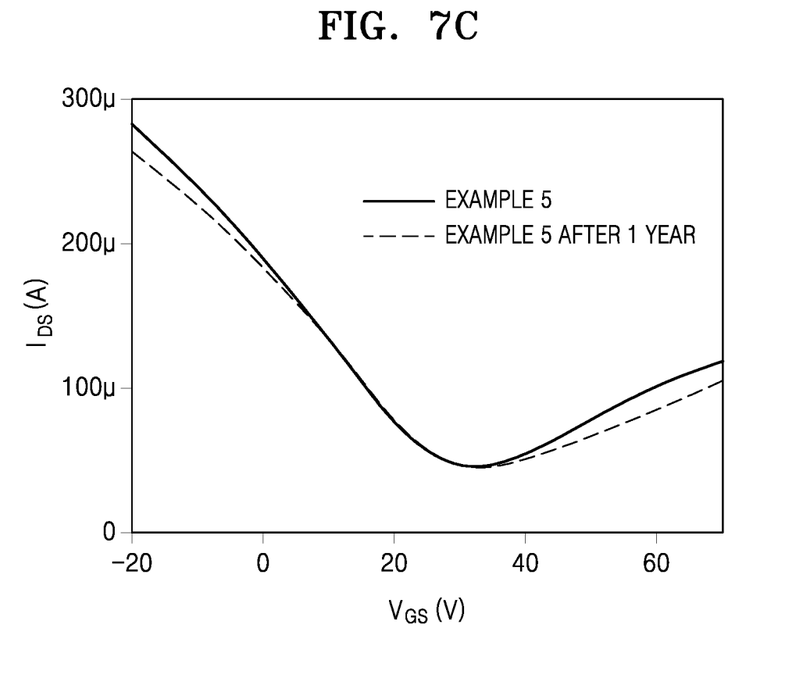
FIG. 7C is a graph showing $I_{DS}$–$V_{GS}$ obtained when a drain source voltage ($V_{DS}$=0.3V) is applied to the back-gated FET prepared in Example 5 and the back-gated FET of Example 5 after 1 year.

Referring to FIG. 7B, it may be confirmed that field effective mobility ($\mu_{FE}$) of electrons and holes of the back-gated FETs of Examples 4 and 5 increased compared to that of the back-gated FET of Comparative Example 2.

Referring to FIG. 7B, the back-gated FET of Example 5 after 1 year had almost the similar curve with that of the back-gated FET of Example 5, except for a small deviation at a high gate voltage.

(2) Electric Characteristics Evaluation 2

Electric characteristics of the LiF layer formed on the graphene layer in the back-gated FETs of Examples 4 to 6 and Comparative Example 2 according to a thickness were evaluated. The results are shown in FIGS. 8A and 8B.

Figure 8A:
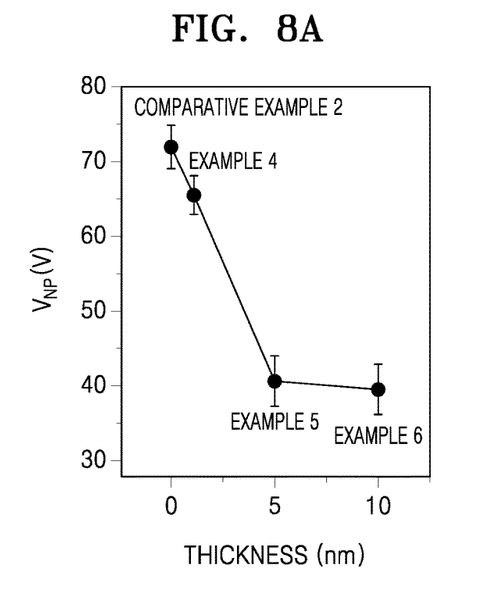
FIG. 8A is a graph showing $V_{NP}$ of a hole charge with respect to a thickness of a LiF layer formed on a graphene layer of a graphene-based laminate in the back-gated FETs prepared in each of Examples 4 to 6 and Comparative Example 2.
Figure 8B:
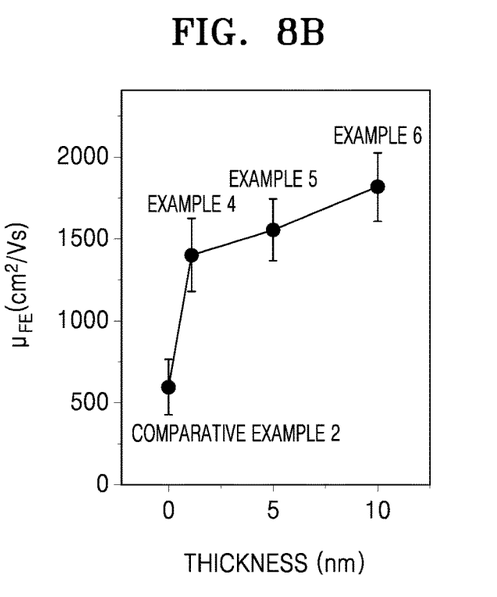
FIG. 8B is a graph showing a field effect mobility ($\mu_{FE}$) of a hole charge with respect to a thickness of a LiF layer formed on a graphene layer of a graphene-based laminate in the back-gated FETs prepared in each of Examples 4 to 6 and Comparative Example 2.

Referring to FIG. 8A, $V_{NP}$ of the hole charge with respect to a thickness of the LiF layer on the graphene layer of the graphene-based laminate in each of the back-gated FETs of Examples 4 to 6 had changes of about 10 V, about 35 V, and about 37 V, respectively, compared to $V_{NP}$ of the hole charge of the graphene-based laminate in the back-gated FET of Comparative Example 2.

Referring to FIG. 8A, field effective mobility ($\mu_{FE}$) of hole charges of the LiF layer on the graphene layer of the graphene-based laminate in each of the back-gated FETs of Examples 4 to 6 with respect to a thickness increased about 150%, about 200%, and about 250%, respectively, compared to a field effective mobility ($\mu_{FE}$) of hole charges of the graphene-based laminate in the back-gated FET of Comparative Example 2.

In this regard, it may be confirmed that the graphene-based laminates in the back-gated FETs of Examples 4 to 6 had stable electron doping effect and improved charge mobility compared to those of the graphene-based laminate in the back-gated FET prepared in Comparative Example 2.

As described above, according to exemplary embodiments, a graphene-based laminate including an inorganic layer that includes a fluorine-containing lithium compound and is formed on a graphene layer may have electron doping stability and improved electron mobility. Also, a method of preparing the graphene-based laminate may improve electron mobility and may be economical.

It should be understood that embodiments described herein should be considered in a descriptive sense only and not for purposes of limitation. Descriptions of features or aspects within each embodiment should typically be considered as available for other similar features or aspects in other embodiments.

While exe embodiments have been described with reference to the drawings, it will be understood by those of ordinary skill in the art that various changes in form and details may be made therein without departing from the spirit and scope of the inventive concept as defined by the following claims.

What is claimed is:

1. A graphene-based laminate comprising:
a substrate;
a graphene layer consisting of graphene formed directly on at least one surface of the substrate; and
an inorganic layer formed directly on the graphene layer and comprising a fluorine-containing lithium compound,
wherein the graphene layer is provided between the substrate and the inorganic layer, and the substrate and the inorganic layer are not in contact with each other, and
wherein an average thickness of the inorganic layer is in a range of about 0.1 nm to about 10 nm.

2. The graphene-based laminate of claim 1, wherein an inorganic material included in the inorganic layer is represented by a following formula:

$$Li_xF_y$$

wherein, x satisfies 1≤x≤10, and y satisfies 1≤y≤10.

3. The graphene-based laminate of claim 1, wherein the inorganic material comprises at least one compound selected from LiF, $LiF_2$, $LiF_3$, $Li_2F$, and $Li_3F_3$.

4. The graphene-based laminate of claim 1, wherein an average thickness of the inorganic layer is in a range of about 0.1 nm to about 5 nm.

5. The graphene-based laminate of claim 1, wherein the graphene layer comprises one layer or a plurality of layers less than or equal to ten layers.

6. The graphene-based laminate of claim 1, wherein the graphene layer has defects on a surface thereof.

7. The graphene-based laminate of claim 1, wherein the substrate comprises at least one material selected from a polymer-based material, a silica-based material, and a metal oxide-based material.

8. A transistor comprising:
a gate layer;
a substrate and an insulating layer formed above the gate layer;
a source electrode and a drain electrode formed above the insulating layer; and
the graphene-based laminate of claim 1 contacting the source electrode and the drain electrode and disposed therebetween.

9. The graphene-based laminate of claim 1, wherein the graphene-based laminate consists of the substrate, the graphene layer and the inorganic layer.

10. An organic light emitting device comprising:
a first electrode comprising the graphene-based laminate of claim 1;
a hole injection layer formed above the first electrode;
a hole transport layer formed above the hole injection layer;
an emission layer formed above the hole transport layer;
an electron transport layer formed above the emission layer;
an electron injection layer formed above the electron transport layer; and
a second electrode.

11. The organic light emitting device of claim 10, wherein the first electrode may be formed of at least one of indium tin oxide (ITO), indium zinc oxide (IZO), tin oxide ($SnO_2$), zinc oxide (ZnO), aluminum (Al), silver (Ag), magnesium (Mg).

12. A method of preparing a graphene-based laminate, the method comprising transferring a graphene layer consisting of graphene directly onto a target substrate to dispose the graphene layer directly on at least one surface of the target substrate; and
depositing an inorganic layer including a fluorine-containing lithium compound directly on the disposed graphene layer,
wherein the graphene layer is provided between the substrate and the inorganic layer, and the substrate and the inorganic layer are not in contact with each other, and
wherein an average thickness of the inorganic layer is in a range of about 0.1 nm to about 10 nm.

13. The method of claim 12, wherein the inorganic material included in the inorganic layer is represented by Formula 1:

$$Li_xF_y$$

wherein, x satisfies 1≤x≤10, and y satisfies 1≤y≤10.

14. The method of claim 12, wherein the graphene layer comprises one layer or a plurality of layers less than or equal to ten layers.

15. The method of claim 12, wherein the transferring the graphene layer to the target substrate further comprises etching the target substrate.

16. The method of claim 12, wherein the target substrate comprises a material selected from a polymer-based material, a silica-based material, and a metal oxide-based material.

17. The method of claim 12, wherein the depositing the inorganic layer is performed by thermal chemical vapor deposition.

18. The method of claim 12, wherein the graphene-based laminate consists of the substrate, the graphene layer and the inorganic layer.

19. The method of claim 12, wherein the graphene layer is grown on the substrate, on which graphene and graphitized catalyst layer are formed.

20. The method of claim 19, wherein the graphene and the graphitized catalyst layer comprises a catalyst selected from Cu, Ni, or an alloy thereof.

* * * * *